United States Patent
Maeda

(10) Patent No.: US 8,345,221 B2
(45) Date of Patent: Jan. 1, 2013

(54) ABERRATION MEASUREMENT METHOD, EXPOSURE APPARATUS, AND DEVICE MANUFACTURING METHOD

(75) Inventor: Hironori Maeda, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/453,907

(22) Filed: Apr. 23, 2012

(65) Prior Publication Data

US 2012/0206701 A1   Aug. 16, 2012

Related U.S. Application Data

(63) Continuation of application No. 12/043,578, filed on Mar. 6, 2008.

(30) Foreign Application Priority Data

Mar. 29, 2007   (JP) .................................. 2007-086469

(51) Int. Cl.
*G03B 27/52*   (2006.01)
*G03B 27/68*   (2006.01)

(52) U.S. Cl. .......................................... 355/55; 355/52

(58) Field of Classification Search .................... 355/53, 355/52, 67, 55; 356/124
See application file for complete search history.

(56) References Cited

U.S. PATENT DOCUMENTS

| | | | |
|---|---|---|---|
| 6,011,611 A * | 1/2000 | Nomura et al. | 355/67 |
| 6,078,380 A * | 6/2000 | Taniguchi et al. | 355/52 |
| 6,549,266 B1 * | 4/2003 | Taniguchi | 355/53 |
| 6,563,564 B2 * | 5/2003 | de Mol et al. | 355/52 |
| 7,262,831 B2 * | 8/2007 | Akhssay et al. | 355/52 |
| 7,602,504 B2 * | 10/2009 | Ando et al. | 356/515 |
| 2003/0091913 A1 * | 5/2003 | Shiode | 430/22 |
| 2004/0105085 A1 * | 6/2004 | Suzuki | 355/69 |
| 2005/0219515 A1 * | 10/2005 | Morohoshi | 356/124 |
| 2007/0258070 A1 * | 11/2007 | Fujiwara | 355/53 |
| 2007/0260419 A1 * | 11/2007 | Hagiwara | 702/150 |
| 2008/0239271 A1 * | 10/2008 | Maeda | 355/67 |

FOREIGN PATENT DOCUMENTS

TW   I254837   5/2006

* cited by examiner

*Primary Examiner* — Peter B Kim
*Assistant Examiner* — Deoram Persaud
(74) *Attorney, Agent, or Firm* — Canon U.S.A., Inc. IP Division

(57) ABSTRACT

A method for measuring a spherical aberration amount of a projection optical system that projects an image of a pattern formed on an original plate onto a substrate, includes: obtaining a first focal position in a direction of an optical axis of the projection optical system under a first measurement condition; obtaining a second focal position in the direction of the optical axis of the projection optical system under a second measurement condition; calculating the spherical aberration amount of the projection optical system based on a difference between the first focal position and the second focal position. Under the first measurement condition the focal position in the direction of the optical axis with respect to the spherical aberration amount does not change; and under the second measurement condition the focal position in the direction of the optical axis with respect to the spherical aberration amount changes.

5 Claims, 15 Drawing Sheets

ABERRATION MEASUREMENT METHOD, EXPOSURE APPARATUS, AND DEVICE MANUFACTURING METHOD

CROSS REFERENCE TO RELATED APPLICATIONS

The present application is a CONTINUATION of co-pending U.S. patent application Ser. No. 12/043,578 filed Mar. 6, 2008, which claims foreign priority from Japanese patent application No. 2007-086469 filed Mar. 29, 2007; the disclosures of both of the above-referenced applications are hereby incorporated by reference herein in their entirety.

BACKGROUND OF THE INVENTION

1. Field of the Invention

The present invention relates to a method for measuring an aberration of a projection optical system of an exposure apparatus used in a lithography process for manufacturing a device such as a semiconductor device or a liquid crystal display device, and an exposure apparatus which is capable of measuring the aberration using a detection unit included in the exposure apparatus.

2. Description of the Related Art

A device having a fine pattern such as a semiconductor device, a liquid crystal display device, or a thin-film magnetic head is manufactured using a photolithography technique. Conventionally, a projection exposure apparatus is used in manufacturing such a device. The projection exposure apparatus is used for transferring a pattern formed on an original plate such as a reticle or a photomask onto a substrate such as a wafer by a projection optical system. The projection exposure apparatus exposes the substrate such as a wafer after aligning a projection image of the pattern of the original plate, which is formed by the projection optical system, with a pattern formed in advance on the substrate, by an alignment detection unit mounted on the apparatus. The position alignment includes an alignment of a pattern of the original plate with a pattern of the substrate as well as focusing of the pattern.

There have been demands for a projection exposure apparatus capable of transferring a reticle pattern onto a wafer with high resolution as development of integrated circuit with finer design and higher density progresses. Since a minimum line width (resolution) which can be transferred by the projection exposure apparatus is proportional to a wavelength of light used for the exposure and in inverse proportion to the numerical aperture (NA) of the projection optical system, higher resolution can be achieved by reducing the wavelength of the light source.

Thus, the light source of recent photolithography is changing to krypton fluoride (KrF) excimer laser with wave length of about 248-nm or argon fluoride (ArF) excimer laser with wave length of about 193-nm in place of the g-line (wave length of about 436 nm) or the i-line (wave length of about 365 nm) produced by a conventional extra-high pressure mercury lamp. Further, F2 laser with wavelength of about 157 nm is being developed. In the future, an exposure apparatus employing extreme ultra violet (EUV) light is expected to achieve a wavelength of a few to a hundred nanometers.

In addition, an immersion exposure apparatus has been developed for further improvement in the resolution of the exposure apparatus. In the immersion exposure apparatus, at least a part of a space between the projection optical system and the wafer is filled with a liquid having a refraction index higher than 1 to increase the NA. To be more precise, the space between the wafer and an apical surface on the wafer side of the projection optical system is filled with a liquid having a refraction index close to that of a photoresist layer. In this way, effective numerical aperture of the projection optical system on the wafer side is increased and the resolution can be improved.

In this type of the immersion exposure apparatus, a pattern formed on a reticle is transferred onto a wafer with precision using a predetermined magnification (reduction ratio). Thus, it is important to employ a projection optical system with enhanced image forming capability and with reduced aberration. However, along with today's increasing demand for an integrated circuit with a finer pattern, a wide exposure area and high NA are requested to the projection optical system, and accordingly a correction of the aberration of the projection optical system is becoming evermore difficult.

While the request for reducing the aberration of such a projection optical system is becoming strong, a need for an exposure apparatus which is capable of measuring and adjusting aberration of the projection optical system mounted on the exposure apparatus is increasing. A change in the aberration occurs due to deterioration of projection lens across the ages, or a thermal effect during an exposure process. Accordingly, an exposure apparatus is required which allows a simple measurement of the aberration state of the projection optical system at regular intervals on the exposure apparatus. In other words, a precise lens adjustment which is in line with the actual state of usage is essential to a highly-integrated device. Such adjustment becomes possible when the aberration of the projection optical system is measured on the exposure apparatus.

However, in a conventional method used for obtaining an aberration of a projection optical system mounted on an exposure apparatus, a pattern is actually exposed and developed and a shift or a shape of the pattern is measured by a scanning electron microscope (SEM) or the like and then an amount of aberration is obtained by estimation. Thus, according to the conventional method, in obtaining the amount of aberration of the projection optical system, a pattern needs to be actually exposed, developed, and its pattern shift needs to be measured by a SEM or the like. Then, based on the obtained amount of aberration, the projection optical system is adjusted. Further, such a sequence has to be repeated again in adjusting the projection optical system. Such a technique is discussed, for example, in Japanese Patent Application Laid-Open No. 8-22951.

The above-described technique in which a pattern is exposed and developed, and the pattern shift or shape is measured in obtaining the amount of aberration, takes considerable amount of time, which has become a problem regarding throughput of the apparatus. Further, determination of a factor which affects the aberration in the resist process or the development process is difficult. Furthermore, the measured amount of aberration tends to vary depending on the operator.

On the other hand, the aberration of the projection optical system is also obtained by using an interferometer which can measure a wavefront aberration. The interferometer is generally used for inspecting the projection optical system at its manufacturing stage. However, it is not generally mounted on the exposure apparatus. This is because the exposure apparatus including the interferometer is larger in size and costs more.

SUMMARY OF THE INVENTION

The present invention is directed to establishing a technique which measures in a simple manner an aberration of a projection optical system using a conventional detection system in an exposure apparatus.

According to an aspect of the present invention, a method for measuring a spherical aberration amount of a projection optical system that projects an image of a pattern formed on an original plate onto a substrate, includes: obtaining a first focal position in a direction of an optical axis of the projection optical system under a first measurement condition by illuminating a mark on the side of an object plane using the first measurement condition so as to project an image of the mark on the side of the object plane onto a mark on the side of an image plane using the projection optical system, and by detecting light passing through the mark on the side of the image plane at a plurality of positions in the direction of the optical axis; obtaining a second focal position in the direction of the optical axis of the projection optical system under a second measurement condition by illuminating the mark on the side of the object plane using the second measurement condition so as to project an image of the mark on the side of the object plane onto the mark on the side of the image plane using the projection optical system, and by detecting light passing through the mark on the side of the image plane at a plurality of positions in the direction of the optical axis; and calculating the spherical aberration amount of the projection optical system based on a difference between the first focal position and the second focal position. The first measurement condition is a condition under which the focal position in the direction of the optical axis with respect to the spherical aberration amount does not change, and the second measurement condition is a condition under which the focal position in the direction of the optical axis with respect to the spherical aberration amount changes.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DETAILED DESCRIPTION OF THE EMBODIMENTS

Various exemplary embodiments, features, and aspects of the invention will be described in detail below with reference to the drawings. First and a second exemplary embodiments are provided which describe a technique used in measuring a spherical aberration of a projection optical system. A third exemplary embodiment is also provided which describes a technique used in measuring a coma aberration.

First Exemplary Embodiment

Figure 1:
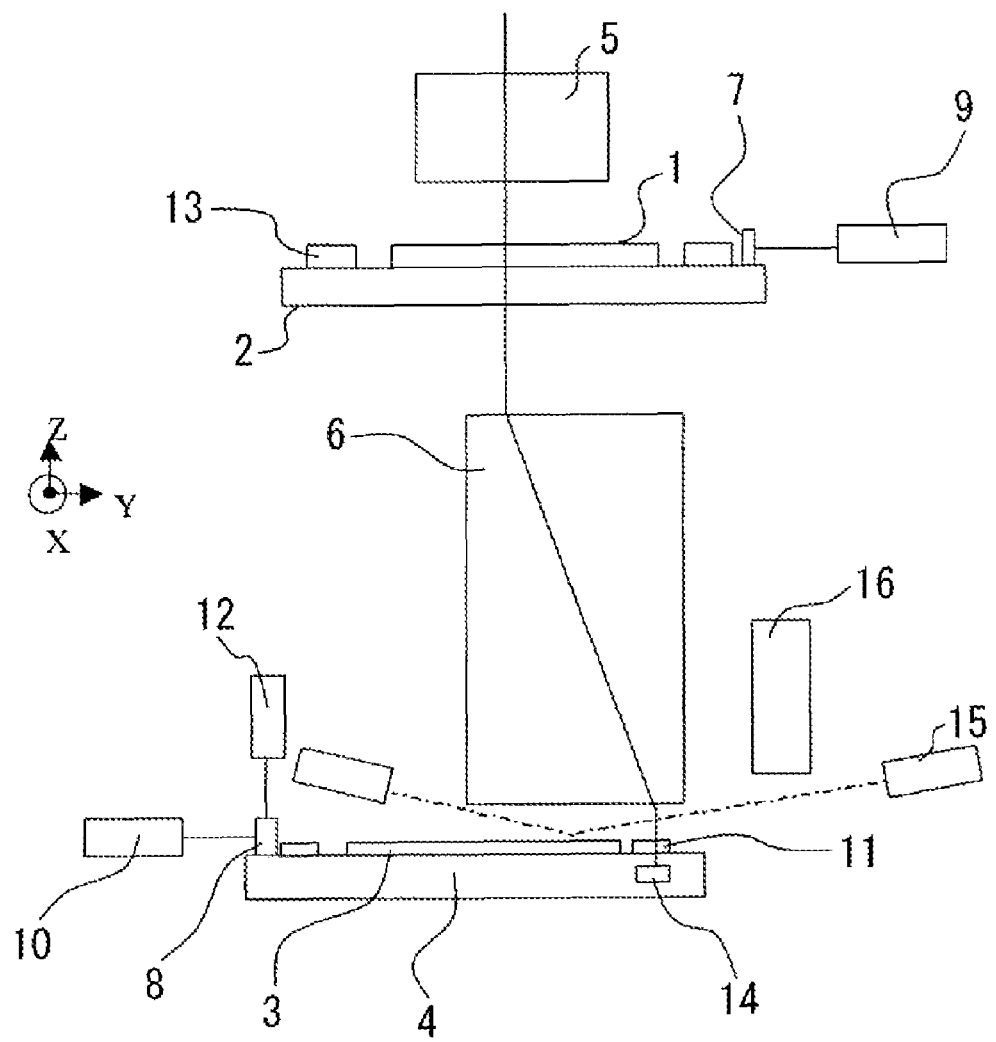
FIG. 1 illustrates an example configuration of a projection exposure apparatus according to an exemplary embodiment of the present invention.

FIG. 1 illustrates an example configuration of a projection exposure apparatus according to an exemplary embodiment of the present invention.

In FIG. 1, an exposure apparatus includes a reticle stage 2 configured to support a reticle 1, a wafer stage 4 configured to support a wafer 3, and an illumination optical system 5 configured to illuminate the reticle 1 with light. Further, the exposure apparatus includes a projection optical system 6 configured to transfer a reticle pattern image of the reticle 1 onto the wafer 3 using light and a control apparatus (not shown) configured to control the overall operation of the exposure apparatus.

According to the present exemplary embodiment, a scanning exposure apparatus is taken as an example of the exposure apparatus. The scanning exposure apparatus projects light through a reticle pattern formed on the reticle 1 onto the wafer 3 while moving the reticle 1 and the wafer 3 in a scanning direction in synchronization with each other. It is to be noted that the present invention may also be applied to an exposure apparatus in which a reticle 1 is fixed and a reticle pattern is transferred to the wafer 3 by step-and-repeat projection.

In the following description, a direction which corresponds to the direction of the optical axis of the projection optical system 6 is referred to as the Z-axis direction, a scanning direction in which the reticle 1 moves in synchronization with the movement of the wafer 3 in a plane perpendicular to the Z-axis direction is referred to as the Y-axis direction, and a non-scanning direction perpendicular to the Z-axis and the Y-axis directions is referred to as the X-axis direction. Further, rotational directions around the X-axis, the Y-axis, and the Z-axis are referred to as a θX, a θY, and a θZ directions respectively.

A predetermined illumination area on the reticle 1 is illuminated with exposure light having even luminance distribution by the illumination optical system 5. The illumination optical system 5 includes an illumination diaphragm (not shown) which is used in switching a lighting condition of the illumination optical system 5. Thus, the lighting condition can be switched when necessary. The exposure light emitted from the illumination optical system 5 is KrF excimer laser, which is used as a replacement of a mercury lamp which used to be a mainstream light source. A light source having a shorter wavelength such as ArF excimer laser or F2 laser is now being put into practical use. Furthermore, an exposure apparatus employing EUV light with a wavelength of a few nm to a hundred nm is being developed.

The reticle stage 2, which supports the reticle 1, is movable in the XY plane, that is, in the plane perpendicular to the optical axis of the projection optical system 6 and, in addition, slightly rotatable in the θZ direction. The reticle stage 2 can be configured to be driven only in one axis direction but is desirably driven in six axis directions. The reticle stage 2 is driven by a reticle stage drive apparatus (not shown) such as a linear motor. The reticle stage drive apparatus is controlled by the control apparatus.

A reticle stage mirror 7 is arranged on the reticle stage 2 and a laser interferometer 9 is arranged in a position facing the reticle stage mirror 7. A position of the reticle 1 on the reticle stage 2 in the XY direction and its rotation angle θZ are measured in real time by the laser interferometer 9 and the measurement results are output to the control apparatus. The control apparatus performs positioning of the reticle 1 supported by the reticle stage 2 by driving the reticle stage drive apparatus based on the measurement results obtained from the laser interferometer 9.

The projection optical system 6, which includes a plurality of optical elements, projects light through the reticle pattern of the reticle 1 at a predetermined projection magnification β onto the wafer 3. According to the present exemplary embodiment, the projection optical system 6 is a reduced projection optical system having the projection magnification β of, for example, ¼ or ⅕.

The wafer stage 4, which supports the wafer 3, includes a Z stage configured to hold the wafer 3 through a wafer chuck, an XY stage configured to support the Z stage, and a base configured to support the XY stage. The wafer stage 4 is driven by a wafer stage drive apparatus (not shown) such as a linear motor. The wafer stage drive apparatus is controlled by a control apparatus.

Further, a wafer stage mirror 8 is arranged on the wafer stage 4. The wafer stage mirror 8 moves according to the movement of the wafer stage 4. A laser interferometer 10 and a laser interferometer 12 are arranged in positions facing the wafer stage mirror 8. A position of the wafer stage 4 in the XY direction and its rotation angle θZ are measured in real time by the laser interferometer 10 and the measurement results are output to the control apparatus. A position of the wafer stage 4 in the Z direction and its rotation angles θX and θY are measured in real time by the laser interferometer 12 and the measurement results are output to the control apparatus. The wafer stage drive apparatus drives the XY and the Z stages to adjust a position of the wafer 3 in the X, Y, and Z directions based on the measurement results obtained from the laser interferometer 10 and 12. Thus, the control apparatus performs positioning of the wafer 3 supported by the wafer stage 4.

Figure 2:
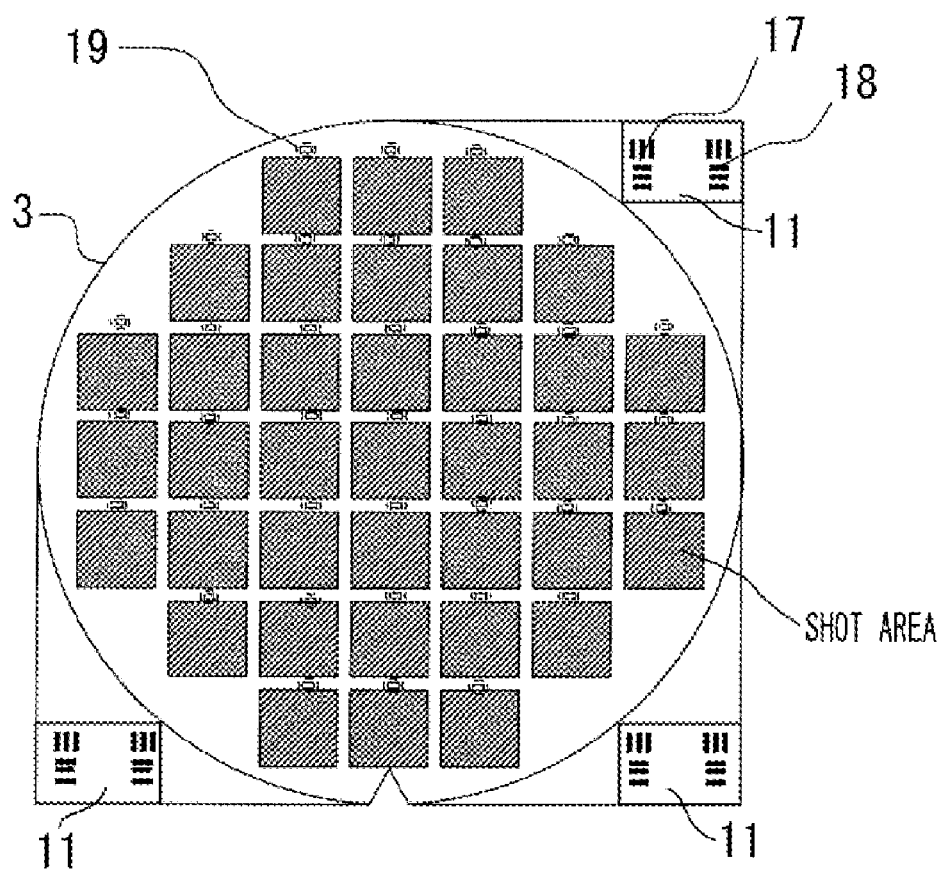
FIG. 2 illustrates an example wafer with a wafer alignment mark.

A position alignment of the reticle 1 and the wafer 3 is performed by aligning a reticle mark (not shown) and a reticle alignment reference mark 17 (see FIG. 2). Both the reticle mark and the reticle alignment reference mark 17 have a plurality of slits. The reticle alignment reference mark 17 has a size of the reticle mark multiplied by a magnification of the projection optical system 6.

The reticle mark is formed on the reticle 1 or on a reticle reference plate 13 mounted on the reticle stage 2. The reticle alignment reference mark 17 is formed on a stage reference plate 11 mounted on the wafer stage 4. More specifically, light from the illumination optical system 5 is directed onto the reticle mark and the reticle alignment reference mark 17 through the projection optical system 6 and a reticle alignment detection unit 14 detects the light transmitted through the reticle alignment reference mark 17.

The reticle alignment detection unit 14 includes a light intensity sensor used for detecting the light transmitted through the reticle alignment reference mark 17. By measuring light intensity of the transmitted light while moving the wafer stage 4 in the X, Y, and Z directions, the wafer stage 4 can be aligned in each direction. That is, the position of the reticle mark formed on the reticle 1 or on the reticle reference plate 13 mounted on the reticle stage 2, and the reticle alignment reference mark 17 can be aligned in the X, Y directions, or focused in the Z directions.

Figure 9:
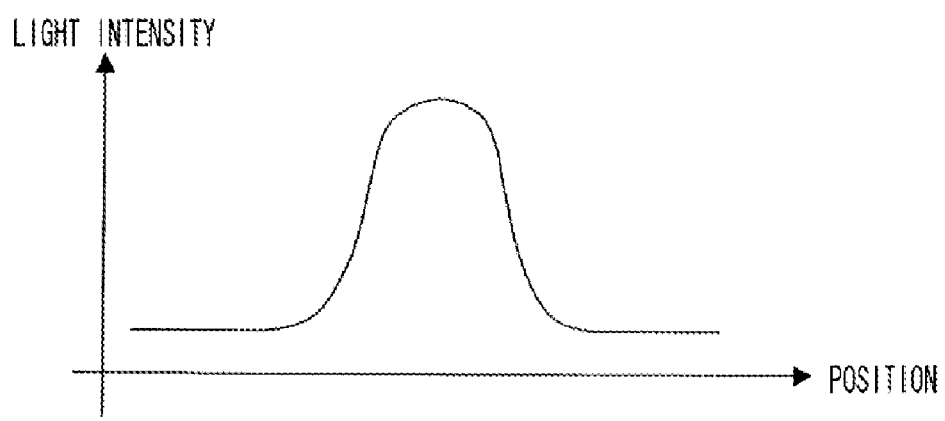
FIG. 9 illustrates a change in light intensity in relation to a position of a wafer stage.
Figure 10:
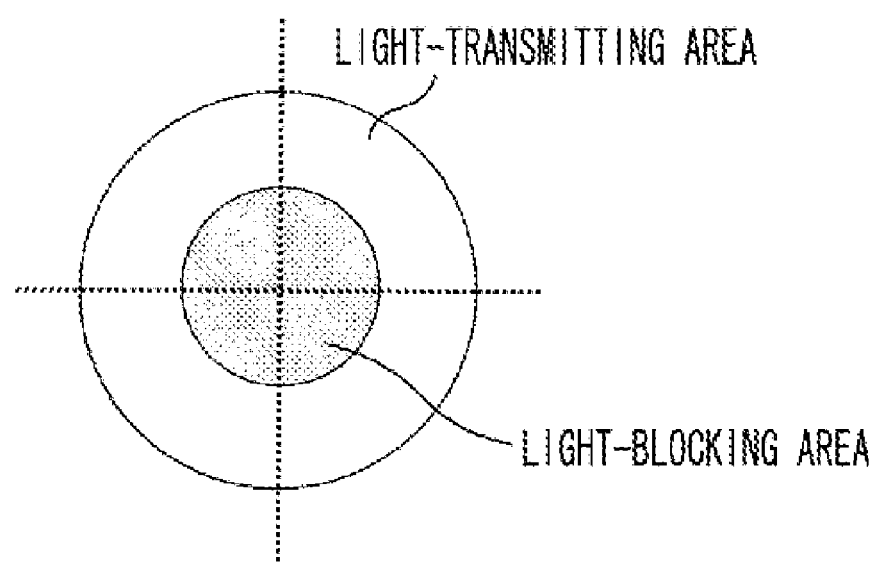
FIG. 10 illustrates an annular stop.

FIG. 9 is a graphical plot of the positions of the wafer stage 4 which is driven in any one direction of the X, Y, and Z directions, on the horizontal axis, and light intensity of a transmitted light at each position on the vertical axis. Data on light intensity at each position of the wafer stage 4 is gathered as shown in FIG. 9, and a position where the light intensity obtained by function fitting or center-of-gravity processing, etc. becomes maximum is regarded as a position where the reticle 1 and the wafer 3 are aligned in the drive direction. Further, a position aligned in the Z direction is defined as a best focus position of the projection optical system 6 according to the present invention.

In FIGS. 1 and 2, the stage reference plate 11 mounted on a corner of the wafer stage 4 is arranged at a substantially same height as the surface of the wafer 3. The stage reference plate 11 includes a wafer alignment detection reference mark 18 to be detected by a wafer alignment detection unit 16 and the reticle alignment reference mark 17 to be detected by the reticle alignment detection unit 14.

The stage reference plate 11 may be arranged at a plurality of corners of the wafer stage 4. Further, one stage reference plate 11 can include a plurality of the reticle alignment reference marks 17 and the wafer alignment detection reference marks 18. It is to be noted that a positional relation of the reticle alignment reference mark 17 and the wafer alignment detection reference mark 18 in the XY directions is assumed to be given. A common mark can be used for the reticle alignment reference mark 17 and the wafer alignment detection reference mark 18.

A focus detection unit 15 includes a light projection unit configured to project detection light on the surface of the wafer 3 and a light receiving unit configured to receive light reflected by the wafer 3. A detection result of the focus detection unit 15 is output to the control apparatus. The control apparatus drives the Z stage based on the detection result obtained from the focus detection unit 15 to adjust a focus position of the wafer 3 held by the Z stage in the Z direction and an inclination angle of the wafer 3.

The wafer alignment detection unit 16 includes a projection unit configured to project detection light onto a wafer alignment mark 19 formed on the wafer 3 and on the wafer alignment detection reference mark 18 formed on the stage reference plate 11. The wafer alignment detection unit 16 also includes a light receiving unit configured to receive light reflected by the wafer alignment mark 19 and the wafer alignment detection reference mark 18. A detection result of the wafer alignment detection unit 16 is output to the control apparatus. The control apparatus drives the wafer stage 4 in the XY directions based on the detection result obtained from the wafer alignment detection unit 16 to adjust a position of the wafer 3 held by the wafer stage 4 in the XY directions.

Next, a measurement method of a spherical aberration of the projection optical system 6 will be described. According to the present exemplary embodiment, a spherical aberration of the projection optical system 6 can be obtained by measuring the best focus position (image formation position) of the projection optical system 6 under a plurality of lighting conditions.

Figure 3:
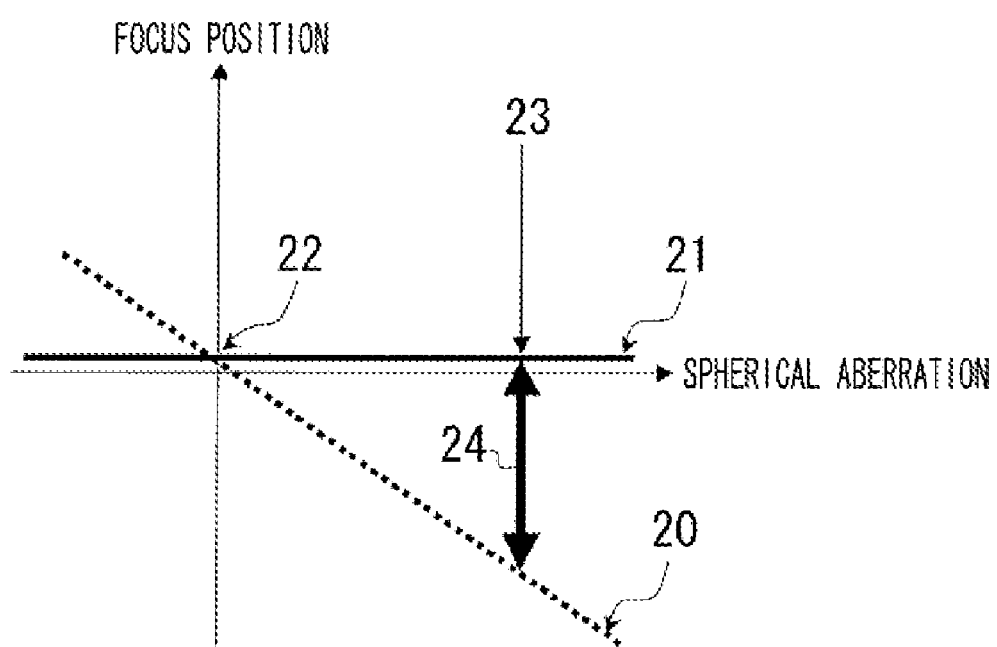
FIG. 3 illustrates a change in a best focus position in relation to a spherical aberration.

First, an example of a relation between the spherical aberration of the projection optical system and the best focus position will be described for each lighting condition. FIG. 3 illustrates a change of a best focus position with respect to a spherical aberration of the projection optical system under two different lighting conditions. A dotted line 20 in FIG. 3 is a graphical plot of data when the illumination diaphragm in the illumination optical system 5 has a circular shape and when an illumination aperture σ is 0.3. As can be seen from the graph, the best focus position changes linearly with respect to the amount of spherical aberration. Here, the illumination aperture σ is a ratio of a pupil size of the illumination optical system 5 to a pupil size of the projection optical system 6 and defined as σ=pupil of the illumination optical system/pupil of the projection optical system.

On the other hand, a solid line 21 in FIG. 3 is a graphical plot of the best focus positions when the illumination diaphragm in the illumination optical system 5 has an annular stop with a light-blocking area in the center. As can be seen from the graph, the best focus position is constant with respect to the amount of spherical aberration. Thus, two illumination conditions exist. One is a lighting condition sensitive to the spherical aberration and the best focus position is linearly changed with respect to a spherical aberration of the projection optical system (the dotted line 20 in FIG. 3). The other is a lighting condition insensitive to the spherical aberration and a best focus position is constant with respect to a spherical aberration of the projection optical system (the solid line 21 in FIG. 3).

If the projection optical system is an ideal system without spherical aberration, the best focus position will be independent of the lighting condition and identical on a point 22 shown in FIG. 3. Further, since the best focus position of the projection optical system is independent of a coma aberration, the relation of the dotted line 20 and the solid line 21 in FIG. 3 does not depend on an amount of the coma aberration of the projection optical system.

Figure 11:
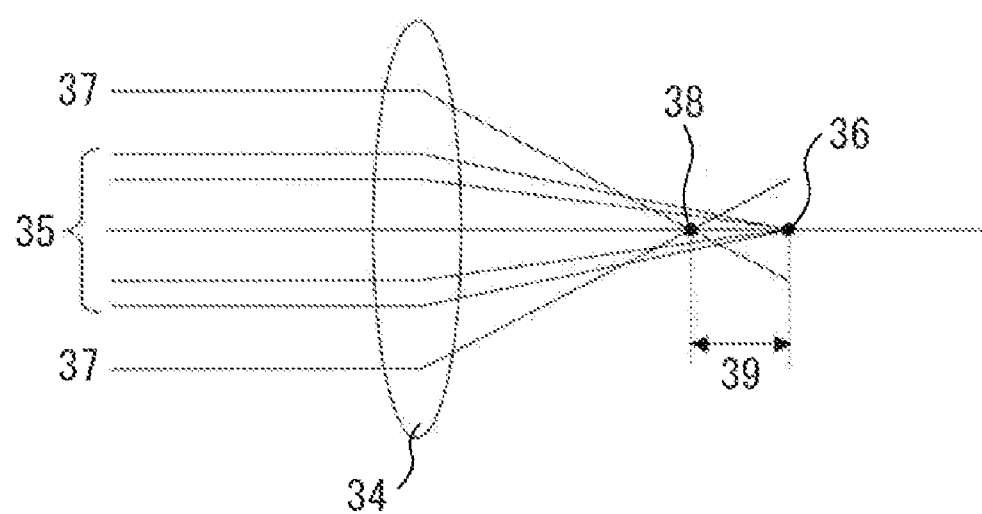
FIG. 11 illustrates an influence of a lighting condition on an aberration.

Next, an effect of the lighting conditions on the aberration will be described referring to FIG. 11. FIG. 11 illustrates light beams 35 and 37 passing through a lens 34 and converged to focal points 36 and 38. The light beam 35 which passes near the center of the lens 34 is focused on the focal point 36, however, the light beam 37 which passes a point away from the center of the lens 34 is focused on the focal point 38 deviating from the focal point 36. This is because the light beam 37 receives greater effect from the spherical aberration of the lens 34 compared to the light beam 35.

Thus, a difference 39 is generated as shown in FIG. 11 between a focal point of the lens 34 under a lighting condition A which extracts only the light beam 35, and a focal point of the lens 34 under a lighting condition B which extracts only the light beam 37. It is known that the difference 39 of the focal points depends on the amount of spherical aberration of the lens 34. Accordingly, the amount of spherical aberration of the lens 34 can be obtained from the difference 39 between two focal points under two lighting conditions A and B. Thus, the amount of aberration of the lens 34 can be estimated from the difference between the focal points which are obtained by changing the lighting conditions.

Generally, an aberration of an optical system of a projection optical system mounted on an exposure apparatus is adjusted based on wavefront aberration data obtained from an interferometer in the manufacturing stage. However, even if the wavefront aberration of the projection optical system is precisely adjusted in the manufacturing stage, the aberration may increase when the projection optical system is mounted on the exposure apparatus. Further, while a finer pattern is demanded, due to effects such as heat generated during exposure or environmental influence (e.g., earthquake), the aberration of the projection optical system which tends to change over time, has become a problem. For example, an amount of spherical aberration as represented by the point 22 in FIG. 3 at the time the exposure apparatus is installed, may gradually shift to a point 23 as time passes. According to the above reason, there has been a strong demand for a simple method for measuring and adjusting an aberration of a projection optical system on the exposure apparatus.

According to the present exemplary embodiment, the spherical aberration of the projection optical system can be measured although it may change as time passes as described above. The spherical aberration of the projection optical system can be obtained from a difference between the best focus position (the reference position) under a reference lighting condition whose best focus position with respect to a spherical aberration is constant at any time, and a best focus position under a lighting condition for spherical aberration measurement whose best focus position with respect to a spherical aberration linearly changes.

For example, if spherical aberration of the projection optical system has an amount as shown by the point 23 in FIG. 3, then a difference 24 between the best focus positions can be obtained from the best focus position under a reference lighting condition whose best focus position is shown by the solid line 21 and the best focus position under a lighting condition for spherical aberration measurement whose best focus position is shown by the dotted line 20. By gathering data on the change in best focus positions under different lighting conditions in advance, the amount of spherical aberration corresponding to the difference 24 can be calculated. Consequently, based on the amount of spherical aberration obtained on the exposure apparatus, the aberration of the projection optical system can be adjusted, and a highly integrated device with high precision can be manufactured.

As described above, the spherical aberration can be obtained by measuring the best focus positions under two measurement conditions. The measurement condition is, for example, a lighting condition. According to the present exemplary embodiment, a first lighting condition (hereinafter referred to as "reference lighting condition") is a lighting condition in which the best focus position with respect to the spherical aberration of the projection optical system is always constant and therefore regarded as a reference lighting condition. A second lighting condition (hereinafter referred to as "spherical aberration measurement lighting condition") is a lighting condition for spherical aberration measurement in which the best focus position with respect to the spherical aberration of the projection optical system linearly changes. According to a difference between the two best focus positions obtained under these two lighting conditions, the spherical aberration of the optical system can be obtained and adjusted and an ideal state of the projection optical system can be maintained on the exposure apparatus.

Figure 4:
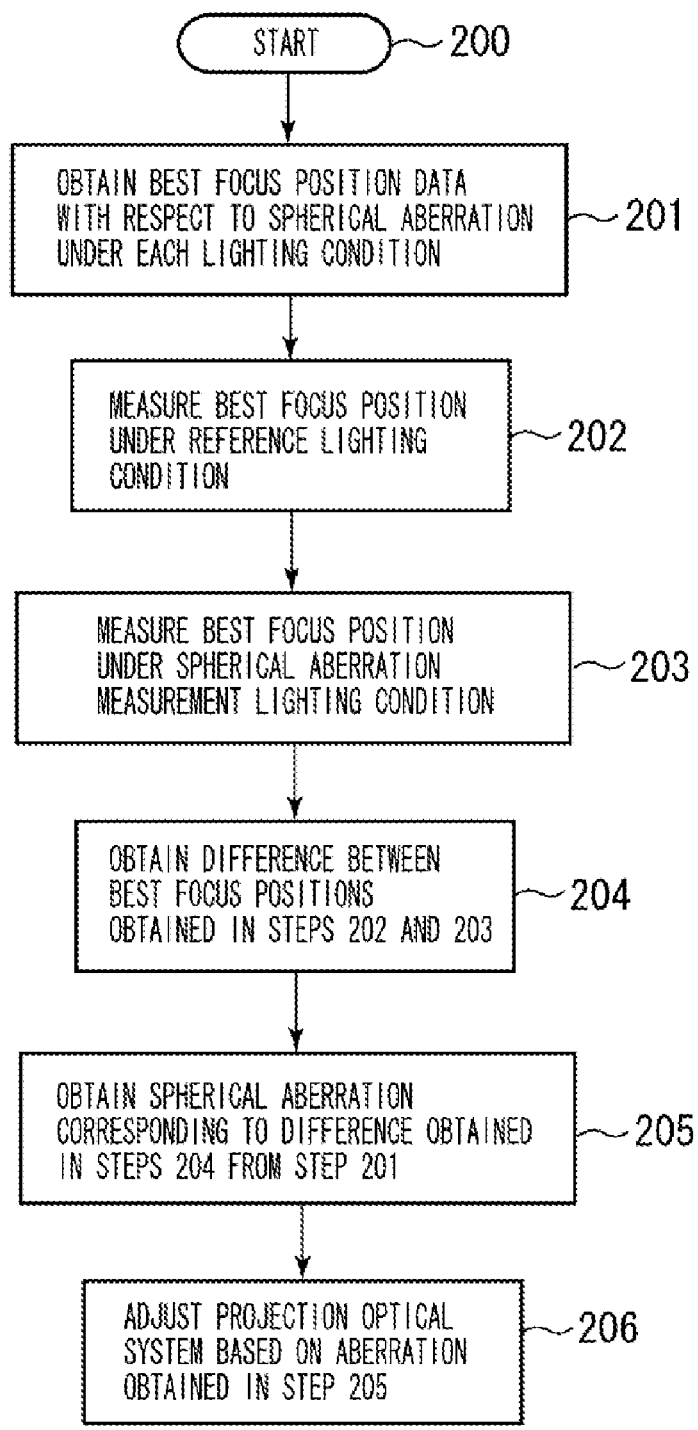
FIG. 4 is a flowchart of an example measurement process of the spherical aberration according to an exemplary embodiment of the present invention.

FIG. 4 is a flowchart illustrating the measurement method of the spherical aberration of the projection optical system according to the present exemplary embodiment.

First, the process is initiated at step 200. Next, in step 201, data on the best focus positions is obtained with respect to the spherical aberrations under lighting conditions including the reference lighting condition and the spherical aberration measurement lighting condition of the projection optical system. The data on the best focus position with respect to each spherical aberration of the projection optical system under the two lighting conditions is obtained by driving a spherical aberration adjustment mechanism included in the exposure apparatus. In this way, the data of the best focus positions with respect to the spherical aberration corresponding to the dotted line 20 and the solid line 21 in FIG. 3 is obtained in advance.

Next, when the spherical aberration of the projection optical system needs adjustment, in step 202, the best focus position under the reference lighting condition is measured. In step 203, the best focus position under the spherical aberration measurement lighting condition is measured. Steps 202 and 203 may be carried out in reverse order. Further, step 202 can be omitted if the height of the reference mark is ensured, since the best focus position under the reference lighting condition in step 202 will be invariable as to the spherical aberration.

In step 204, a difference between the best focus position under the spherical aberration measurement lighting condition obtained in step 203 and the best focus position under the reference lighting condition obtained in step 202 or the best focus position under the reference lighting condition obtained in step 201 is obtained. In this way, data corresponding to the difference 24 in FIG. 3 can be obtained.

In step 205, a spherical aberration which corresponds to the difference of the best focus positions obtained in step 204 is obtained based on the data on the best focus positions of the spherical aberration under each lighting condition obtained in step 201. In this way, an amount of spherical aberration of the projection optical system can be obtained as the amount of spherical aberration 23 corresponding to the difference 24 in FIG. 3.

Finally, in step 206, the projection optical system is adjusted based on the spherical aberration of the projection optical system obtained in step 205.

According to the present exemplary embodiment, the illumination value σ of the lighting condition for the best focus positions represented by the dotted line 20 in FIG. 3 is 0.3, and the lighting condition for the best focus positions presented by the solid line 21 is that of an annular stop. The present invention, however, is not limited to such lighting conditions. The lighting condition may have any illumination value σ or annular zone ratio so long as it produces a difference such as the difference 24 shown in FIG. 3.

Figure 15:
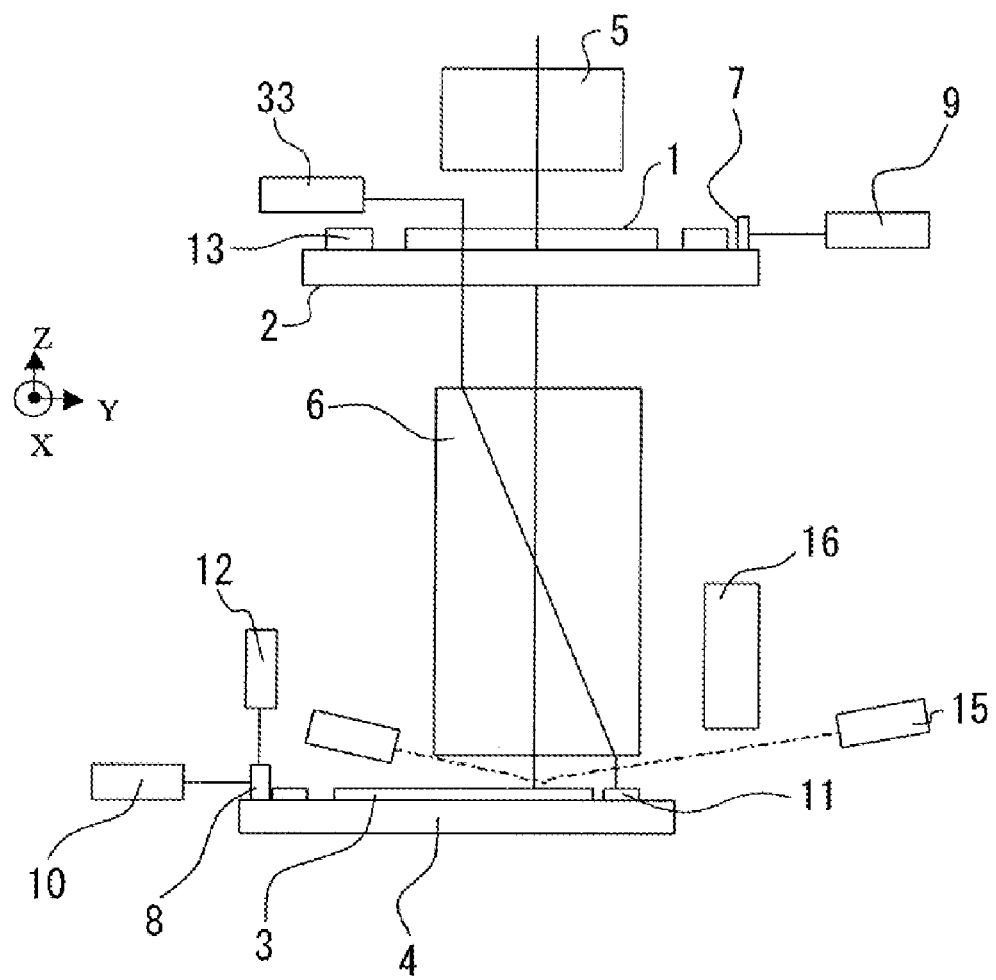
FIG. 15 illustrates an example configuration of the projection exposure apparatus according to an exemplary embodiment of the present invention.

According to the present exemplary embodiment, the reticle alignment detection unit 14, which is a transmission-type detection unit, is used to detect the light transmitted through the reticle alignment reference mark 17. The present invention, however, is not limited to such a detection unit and any type of detection unit can be used so long as a spherical aberration and a coma aberration of the projection optical system can be separately measured. For example, a reflection-type reticle alignment detection unit 33 illustrated in FIG. 15 may be used in the present exemplary embodiment.

The reflection-type reticle alignment detection unit 33 uses a light source same as the light source actually used to expose the wafer 3. The reflection-type reticle alignment detection unit 33 emits light on a reticle mark (not shown) and on the reticle alignment reference mark 17 through the projection optical system 6. The reticle mark is formed on the reticle 1 or on the reticle reference plate 13 on the reticle stage 2. The reticle alignment reference mark 17 is formed on the stage reference plate 11 which is arranged on the wafer stage. Further, the reflection-type reticle alignment detection unit 33 is mounted with a photoelectric conversion device (e.g., CCD camera) used for detecting the reflected light.

Second Exemplary Embodiment

In the first exemplary embodiment, a method is described for obtaining a spherical aberration from a difference in the best focus positions which is obtained by adjusting the illumination diaphragm (not shown) in the illumination optical system 5 under two different lighting conditions. However, the measurement conditions according to the present invention is not limited to switching of the lighting conditions so long as a difference is made between the best focus positions with respect to the spherical aberration as illustrated by the dotted line 20 and the solid line 21 in FIG. 3. For example, under a same lighting condition (i.e., the same illumination diaphragm (not shown) in the illumination optical system 5), a pitch of the reticle marks (not shown) formed on the reticle 1 or on the reticle reference plate 13 may be changed. In this case, the spherical aberration is obtained by a difference in the best focus positions with respect to the spherical aberration under two measurement conditions (i.e., two different pitches).

By changing the pitch of the reticle mark and thus changing the light distribution, an effect of the aberration on the diffracted light will be changed. The amount of aberration of a lens can be obtained according to a difference of the effect of the reflected light from the lens.

Figure 12:
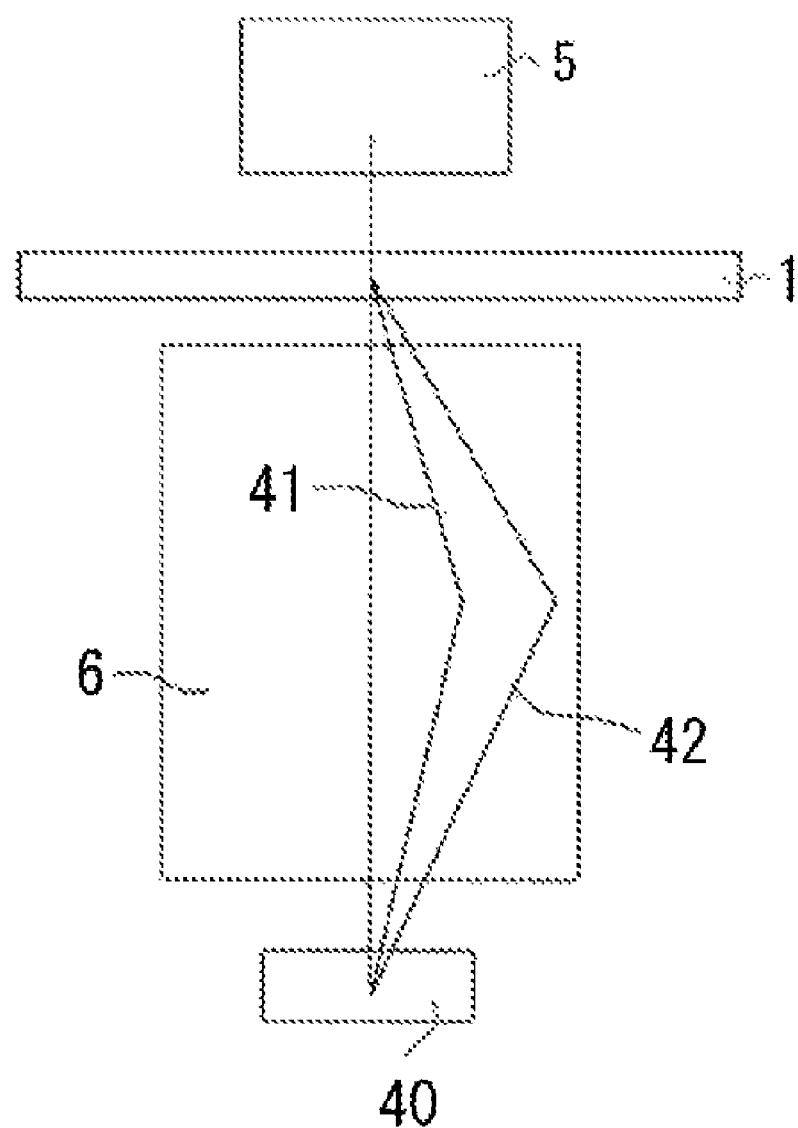
FIG. 12 illustrates an effect of a reticle mark on the aberration.

FIG. 12 is a schematic view of the exposure apparatus. An illumination light emitted from the illumination optical system 5 reaches a measurement sensor 40 through the reticle 1 and the projection optical system 6. For example, a reticle mark A and a reticle mark B having half the pitch of the reticle mark A are formed on the reticle 1. In this case, while two diffracted lights 41 and 42 are generated from the reticle marks A, the reticle mark B, having half the pitch of the reticle mark A, generates only the diffracted light 42 under the same lighting condition.

Thus, by using reticle marks having a different mark pitch, diffracted lights show a different light distribution. The effects of aberration in the projection optical system 6 are different and an amount measured by the measurement sensor 40 shows difference even under the same lighting condition. This difference in measurement depends on the amount of aberration of the projection optical system. It is therefore possible to know the amount of aberration of the projection optical system 6 by measuring the difference between the two different reticle marks with the measurement sensor 40.

Figure 5:
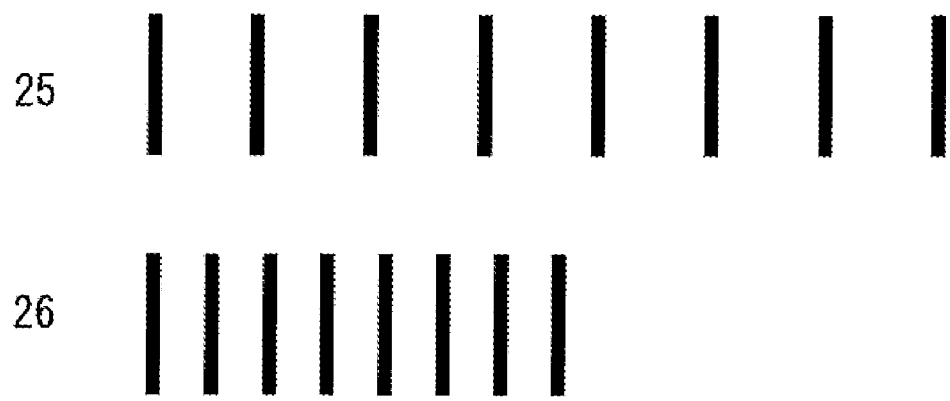
FIG. 5 illustrates a mark on a reticle according to an exemplary embodiment of the present invention.

Next, a spherical aberration measurement using the reticle marks having a different pitch will be described referring to FIG. 5. A reticle mark 25 shown in FIG. 5 is a line-and-space reticle mark formed on the reticle 1 or on the reticle reference plate 13. The reticle mark 25 has a same line-and-space pitch as the reticle alignment reference mark 17.

If, for example, the illumination diaphragm in the illumination optical system 5 is set to σ=0.3, and a difference in the best focus positions with respect to the spherical aberration is measured using the reticle mark 25, data shown by the dotted line 20 in FIG. 3 is obtained. On the other hand, if the reticle mark 26 having a narrower line-and-space than the reticle mark 25 is used under the same lighting condition (σ=0.3), the difference between the best focus positions with respect to the spherical aberration is indicated by the solid line 21 in FIG. 3.

This means that even if the lighting condition is the same and the illumination diaphragm (not shown) in the illumination optical system 5 is fixed, a spherical aberration measurement of the projection optical system becomes possible by using reticle marks with a different pitch. If the aberration of the projection optical system is measured using the pitch difference of the reticle marks, the reticle mark 25 in FIG. 5 corresponds to the spherical aberration measurement lighting condition in FIG. 4 and the reticle mark 26 corresponds to the reference lighting condition in FIG. 4.

In the above description, two different reticle marks having a different pitch are used while a mark is fixed on a wafer under the same lighting condition. However, two reticle alignment reference marks 17 having a different pitch may be used with a fixed reticle mark and under a fixed lighting condition as a measurement condition.

Alternate Versions of the First and the Second Exemplary Embodiments

The spherical aberration of the projection optical system which is measured in the above-described manner can be automatically adjusted by a driving apparatus (not shown) provided in the spherical aberration adjustment mechanism in the projection optical system. The automatic spherical aberration adjustment is desirably performed at the time of periodic maintenance of the exposure apparatus or when a trouble arises in the apparatus.

When the spherical aberration of the projection optical system is detected as described above, the aberration may be more precisely measured and adjusted by actually exposing and developing a pattern, and a shift or a shape of the pattern may be measured by a SEM or the like to estimate an amount of aberration. This method uses the spherical aberration measurement of the projection optical system according to the present invention for the detection of the aberration, and actually exposes and develops a pattern only when the measurement value exceeds a threshold value, to adjust the aberration of the projection optical system.

Third Exemplary Embodiment

According to the first and the second exemplary embodiments, the spherical aberration of the projection optical system is adjusted under two different measurement conditions. According to the present exemplary embodiment, a coma aberration of the projection optical system is adjusted under two different lighting conditions. An example of the exposure apparatus used in the present exemplary embodiment is illustrated in FIG. 1.

In the present exemplary embodiment, as well as the first and the second exemplary embodiments, light from the illumination optical system 5 is directed onto the reticle mark and the reticle alignment reference mark 17 through the projection optical system 6 and a reticle alignment detection unit 14 detects the light passed through the reticle alignment reference mark 17.

According to the first and the second exemplary embodiments, the focus position of the projection optical system was measured by detecting the light passed through the reticle alignment reference mark 17 while moving the wafer stage 4 in the Z direction.

In the present exemplary embodiment, the light passed through the reticle alignment reference mark 17 is detected while moving the wafer stage 4 in the X or Y direction. That is, the relative position of the reticle mark and the reticle alignment reference mark 17 in the X or Y direction is measured. The coma aberration of the projection optical system is obtained from the shift of the relative position due to the measurement condition change.

First, a relation of the coma aberration of the projection optical system and a shift position is described according to each lighting condition.

Figure 6:
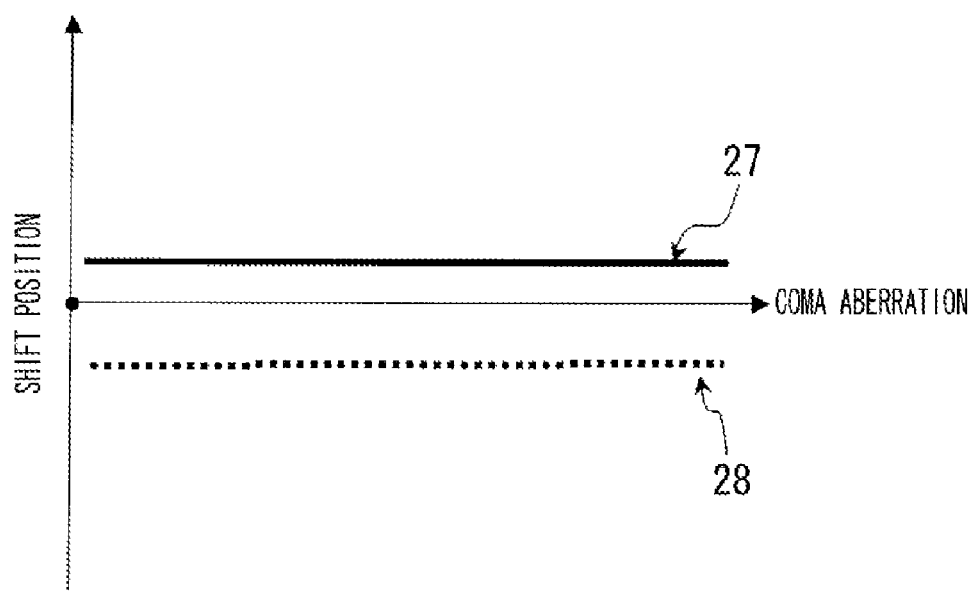
FIG. 6 illustrates a change in the best focus position in relation to a coma aberration.

FIG. 6 illustrates a change in shift positions with respect to a coma aberration of the projection optical system at the best focus position of the projection optical system under two different lighting conditions. A solid line 27 in FIG. 6 is a graphical plot of shift positions when an illumination diaphragm in the illumination optical system 5 has an annular stop. As can be seen from the graph, the shift position are constant with respect to the coma aberration. On the other hand, a dotted line 28 in FIG. 6 is a graphical plot of shift positions when the illumination value σ is 0.3. As can be seen from the graph, these shift positions are also constant with respect to the coma aberration. In other words, since a shift difference with respect to the coma aberration is not generated (or the difference is small even if it is generated), the coma aberration of the projection optical system is not obtained from the shift difference at the best focus position of the projection optical system in FIG. 6 under two different lighting conditions.

Figure 7:
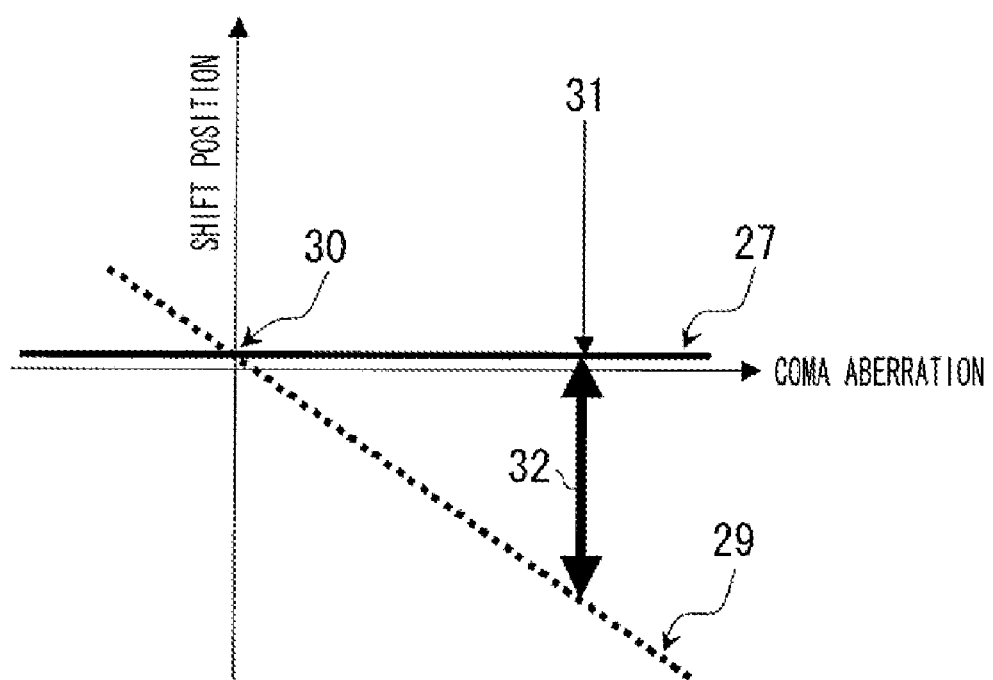
FIG. 7 illustrates a change in a predetermined defocus position in relation to the coma aberration.

Next, the change in shift positions with respect to the coma aberration at a focus position defocused from the best focus position of the project optical system (hereinafter referred to as "coma aberration measurement defocus position") will be described. A dotted line 29 in FIG. 7 is a graphical plot of shift position change with respect to the coma aberration at the coma aberration measurement defocus position of the projection optical system when the illumination value σ is 0.3. In other words, the dotted line 29 is a defocused version of the dotted line 28 in FIG. 6.

As can be seen from the dotted line 29 in FIG. 7, a shift position difference is generated with respect to the coma aberration. Accordingly, the coma aberration in the projection optical system can be obtained by detecting the shift difference relative to the solid line 27. In other words, a lighting condition exists which allows a linear change in shift position with respect to the coma aberration in the projection optical system at the coma aberration measurement defocus position of the projection optical system. This lighting condition (the dotted line 29) is sensitive to the coma aberration.

According to the present exemplary embodiment, the coma aberration of the projection optical system is obtained under a lighting condition which is sensitive to shift with respect to a coma aberration at the coma aberration measurement defocus position, and a lighting condition which is insensitive to shift with respect to a coma aberration. A point 30 in FIG. 7 is a point where the coma aberrations are adjusted.

Generally, an aberration of an optical system of a projection optical system mounted on an exposure apparatus is adjusted based on wavefront aberration data obtained from an interferometer in the manufacturing stage. However, even if the wavefront aberration of the projection optical system is precisely adjusted in the manufacturing stage, the aberration may increase when the projection optical system is mounted on the exposure apparatus. Further, while devices having finer patterns are demanded, due to effects such as heat generated during exposure or environmental influence (e.g., earthquake), the aberration of the projection optical system which tends to change over time, has become a problem. Accordingly, there has been a strong demand for establishing a method of measuring an aberration of a projection optical system on the exposure apparatus.

According to the present exemplary embodiment, the coma aberration of the projection optical system can be measured although the coma aberration appears as time passes as described above. The coma aberration of the projection optical system can be obtained from the difference between the reference position under a lighting condition under which the shift position with respect to a coma aberration is unchanged at any time, and a shift position under a lighting condition for coma aberration under which the shift position with respect to a coma aberration linearly changes. According to the present exemplary embodiment, the lighting condition for coma aberration under which the shift position with respect to a coma aberration linearly changes, is a lighting condition under which the coma aberration is measured at the coma aberration measurement defocus position of the projection optical system.

For example, if the amount of spherical aberration of the projection optical system is the one as shown by the point 31 in FIG. 7, then a difference 32 between the shift positions can be obtained from the shift position under a reference lighting condition whose shift positions are shown by the solid line 27, and the shift position under a lighting condition for coma aberration whose shift positions are shown by the dotted line 29. By gathering data on the change in shift positions under different lighting conditions in advance, the amount of coma aberration corresponding to the difference 32 can be obtained. If the amount of coma aberration is obtained on the exposure apparatus, the aberration of the projection optical system can be adjusted, and a highly integrated device with high precision can be manufactured.

As described above, by obtaining the coma aberration of the projection optical system from a difference between two shift positions under two lighting conditions, the coma aberration of the projection optical system can be adjusted, and an ideal state of the projection optical system can be maintained at all times on the exposure apparatus. According to the present exemplary embodiment, a first lighting condition (hereinafter referred to as "reference lighting condition") is a lighting condition in which the shift positions with respect to the coma aberration of the projection optical system are unchanged at any time and therefore can be regarded as a reference lighting condition. A second lighting condition (hereinafter referred to as "coma aberration measurement lighting condition") is a lighting condition for coma aberration measurement in which the shift positions with respect to the coma aberration of the projection optical system linearly change.

Figure 8:
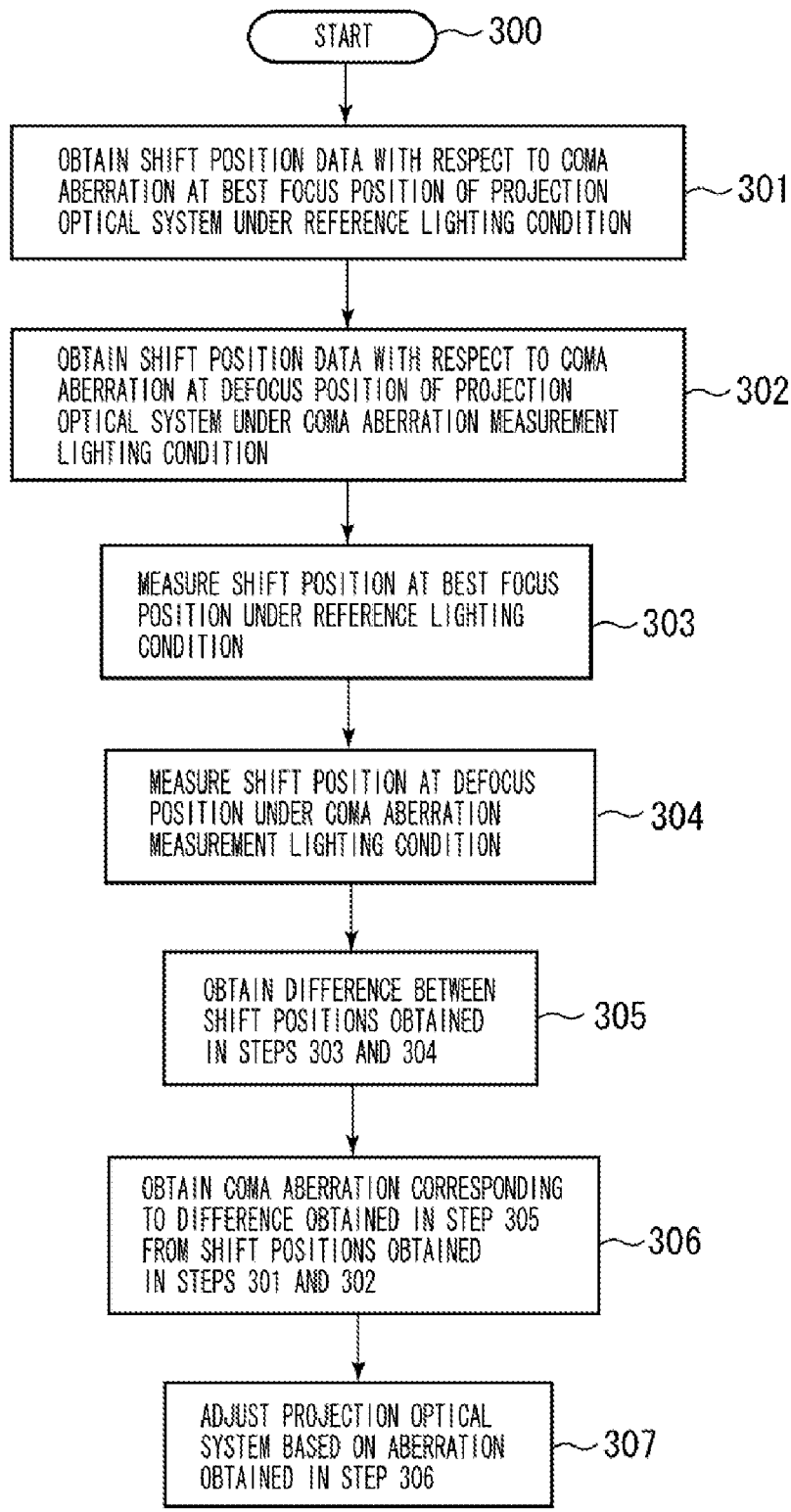
FIG. 8 is a flowchart of an example measurement process of the coma aberration according to an exemplary embodiment of the present invention.

FIG. 8 is a flowchart illustrating the measurement method of the coma aberration of the projection optical system according to the present exemplary embodiment. According to the present exemplary embodiment, data on the change in the shift position with respect to the coma aberration under the coma aberration measurement lighting condition is measured at the coma aberration measurement defocus position of the projection optical system.

First, the process is initiated in step 300. Next, in step 301, data on the shift positions with respect to a coma aberration under the reference lighting condition is obtained at the best focus position of the projection optical system.

In step 302, data on the shift positions with respect to a coma aberration under the coma aberration measurement lighting condition is obtained at the coma aberration measurement defocus position of the projection optical system. In this way, data corresponding to the solid line 27 and the dotted line 29 in FIG. 8 can be obtained. The order of steps 301 and 302 may be reversed.

In step 303, the shift position at the best focus position of the projection optical system is measured under the reference lighting condition.

In step 304, at the coma aberration measurement defocus position of the projection optical system, the shift position is measured under the coma aberration measurement lighting condition. The order of steps 303 and 304 may be reversed.

Further, step 303 can be omitted since the shift position under the reference lighting condition in step 303 is invariable as to the coma aberration.

In step 305, a difference in shift positions is obtained from the shift position measured in step 304 under the coma aberration measurement lighting condition and the shift position measured in step 303 under the reference lighting condition or the shift position obtained in step 301 under the reference lighting condition. In this way, a shift difference corresponding to the difference 32 in FIG. 7 can be obtained.

In step 306, a coma aberration corresponding to the difference obtained in step 305 is obtained from the data on the shift positions with respect to the coma aberration under the two different lighting conditions obtained in steps 301 and 302. In this way, an amount of coma aberration 31 of the projection optical system can be obtained which corresponds to the difference 32 in FIG. 7.

Finally, in step 307, the projection optical system is adjusted based on the coma aberration of the projection optical system obtained in step 306.

According to the present exemplary embodiment, the illumination value σ of the lighting condition for the shift positions represented by the dotted line 29 in FIG. 7 is 0.3 and the lighting condition for the shift positions represented by the solid line 27 is that the light passes through an annular stop. The present invention, however, is not limited to such lighting conditions. The lighting conditions may have any illumination σ value or annular zone ratio so long as they produce a difference such as the difference 32 shown in FIG. 7.

According to the present exemplary embodiment, the reticle alignment detection unit 14, which is a transmission-type detection unit, is used to detect the light transmitted through the reticle alignment reference mark 17. The present invention, however, is not limited to such a detection unit, and any type of detection unit can be used so long as a spherical aberration and a coma aberration of the projection optical system can be separately measured. For example, a reflection-type reticle alignment detection unit 33 illustrated in FIG. 15 may be used in the present exemplary embodiment.

The reflection-type reticle alignment detection unit 33 uses a light source same as the light source with which the wafer 3 is actually exposed. The reflection-type reticle alignment detection unit 33 emits light onto a reticle mark (not shown) and onto the reticle alignment reference mark 17 through the projection optical system 6. The reticle mark is formed on the reticle 1 or on the reticle reference plate 13 on the reticle stage 2. The reticle alignment reference mark 17 is formed on the stage reference plate 11 which is arranged on the wafer stage. The reflected light is detected by a photoelectric conversion device (e.g., CCD camera).

The coma aberration of the projection optical system which is measured in the above-described manner can be automatically adjusted by a driving apparatus (not shown) included in the coma aberration adjustment mechanism in the projection optical system. The automatic adjustment is performed desirably at the time of periodic maintenance of the exposure apparatus or when a trouble arises in the apparatus When the coma aberration of the projection optical system is detected as described above, the aberration may be more precisely measured and adjusted by actually exposing and developing a pattern, and measuring a shift or a shape of the pattern by a SEM or the like to estimate an amount of aberration. This method uses the coma aberration measurement of the projection optical system according to the present invention for the detection of the aberration, and actually exposes and develops a pattern only when the measurement value exceeds a threshold value, to adjust the aberration of the projection optical system.

According to the above-described exemplary embodiments, a difference in the best focus positions or a shift difference are measured under a plurality of measurement conditions. In this way, a spherical aberration and a coma aberration of the projection optical system can be measured using a component which is conventionally provided in the exposure apparatus, and the projection optical system can be adjusted in a simple manner. Further, since the aberration state of the projection optical system can be adjusted on the exposure apparatus, adverse effect of the aberration on the electronic circuit pattern image can be minimized in the projection exposure apparatus using the above-described technique. This contributes to constantly obtaining an electronic circuit pattern with high resolution.

Further, since the above-described technique eliminates the need for a microscope such as the SEM in measuring the aberration of the projection optical system, the measurement does not require a dedicated operator. Furthermore, compared to the conventional measurement using a microscope such as the SEM, the measurement time is significantly reduced. Furthermore, since automated aberration measurement and automated adjustment of the projection optical system can be easily performed on the exposure apparatus, a device having a fine circuit pattern can be produced constantly.

Figure 13:
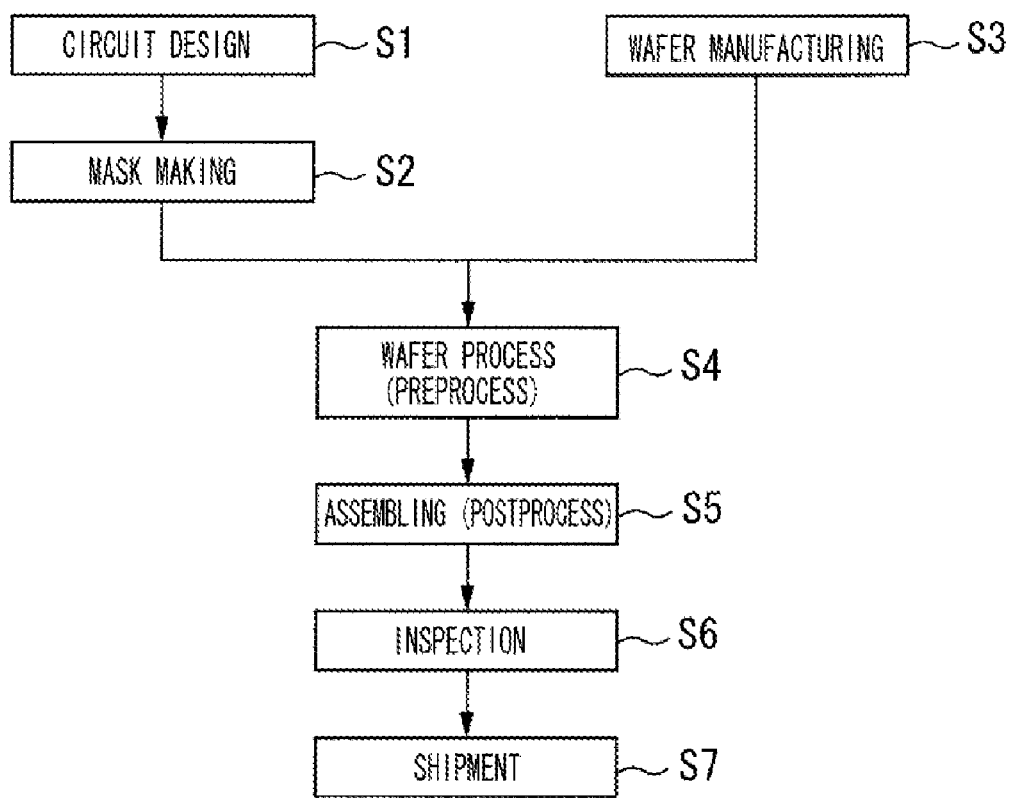
FIG. 13 is a flowchart illustrating exemplary manufacturing processes for a semiconductor device using the exposure apparatus according to an exemplary embodiment of the present invention.

Next, a device manufacturing method using the above-described projection exposure apparatus will be described referring to FIGS. 13 and 14. FIG. 13 is a flowchart illustrating exemplary manufacturing processes for a semiconductor device (e.g., an integrated circuit (IC), a large scale integration (LSI), a liquid crystal display (LCD), and a charge-coupled device (CCD)). Here, a manufacturing method of a semiconductor chip will be described.

Step S1 is a circuit design process for designing a circuit of a semiconductor device. Step S2 is a process for manufacturing a mask, which can be referred to as an original plate or a reticle, based on a designed circuit pattern. Step S3 is a process for manufacturing a wafer, which can be also referred to as a substrate, from a silicon or comparable material. Step S4 is a wafer process, which can be referred to as "preprocess", for forming an actual circuit on a wafer using an exposure apparatus with the above-described mask according to the lithography technique. Step S5 is an assembling process, which can be referred to as "postprocess", for forming a semiconductor chip using the wafer manufactured in step S4. The postprocess includes an assembly process (e.g., dicing, bonding, etc.) and a packaging process (chip sealing). Step S6 is an inspection process for inspecting the semiconductor device manufactured in step S5. The inspection includes an operation confirmation test and an endurance test. Step S7 is a shipment process for shipping the semiconductor device completed through the above-described processes.

Figure 14:
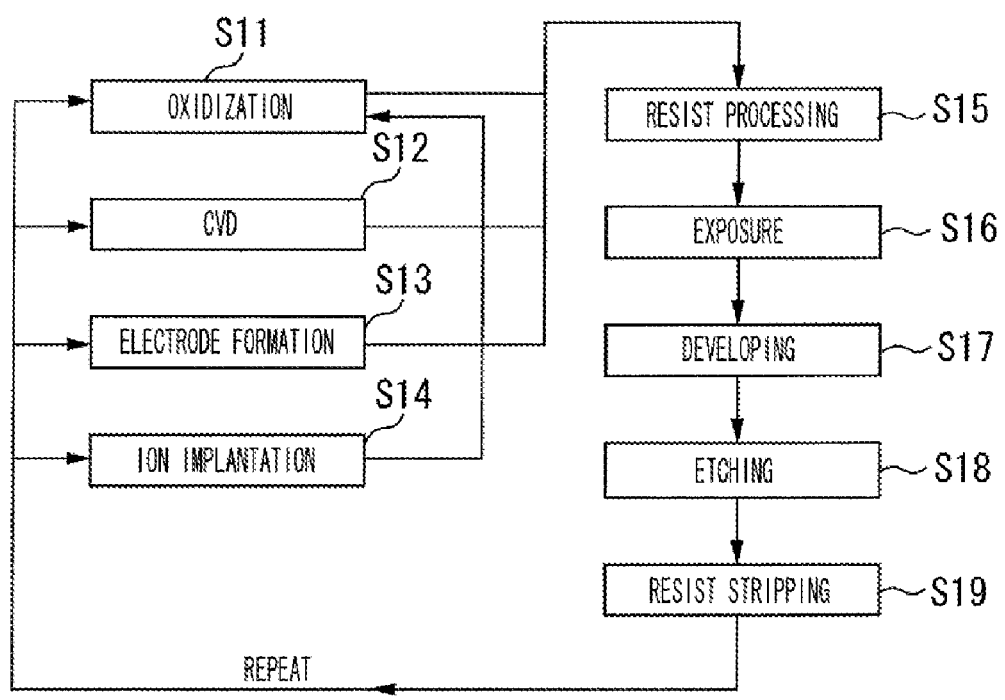
FIG. 14 is a flowchart illustrating a wafer process of the manufacturing processes illustrated in FIG. 11.

FIG. 14 is a detailed flowchart of the wafer process in step S4 of FIG. 13. The wafer process in step S4 includes an oxidation step S11 for oxidizing a wafer surface, a chemical vapor deposition (CVD) step S12 for forming an insulating film on the wafer surface, and an electrode formation step S13 for forming electrodes on the wafer by vaporization. Furthermore, the wafer process in step S4 includes an ion implantation step S14 for implanting ions into the wafer, a resist processing step S15 for coating the wafer with a photosensitive material, and an exposure step S16 for exposing the wafer subjected to the resist processing step to light using the above-described exposure apparatus with a mask having a circuit pattern. Furthermore, the wafer process in step S4 includes a developing step S17 for developing the wafer exposed in the exposure step S16, an etching step S18 for cutting a portion other than a resist image developed in the developing step S17, and a resist stripping step S19 for removing an unnecessary resist remaining after the etching step S18. The processing repeating the above-described steps can form multiple circuit patterns on a wafer.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2007-086469 filed Mar. 29, 2007, which is hereby incorporated by reference herein in its entirety.

What is claimed is:

1. A method for measuring a spherical aberration amount of a projection optical system that projects an image of a pattern formed on an original plate onto a substrate, the method comprising:

obtaining a first focal position in a direction of an optical axis of the projection optical system under a first measurement condition by illuminating a mark on the side of an object plane using the first measurement condition so as to project an image of the mark on the side of the object plane onto a mark on the side of an image plane using the projection optical system, and by detecting light passing through the mark on the side of the image plane at a plurality of positions in the direction of the optical axis;

obtaining a second focal position in the direction of the optical axis of the projection optical system under a second measurement condition by illuminating the mark on the side of the object plane using the second measurement condition so as to project an image of the mark on the side of the object plane onto the mark on the side of the image plane using the projection optical system, and by detecting light passing through the mark on the side of the image plane at a plurality of positions in the direction of the optical axis; and calculating the spherical aberration amount of the projection optical system based on a difference between the first focal position and the second focal position, wherein the first measurement condition is a condition under which the focal position in the direction of the optical axis with respect to the spherical aberration amount does not change, and wherein the second measurement condition is a condition under which the focal position in the direction of the optical axis with respect to the spherical aberration amount changes.

2. The method according to claim 1, wherein a pitch of the mark on the side of the object plane under the first measurement condition is different from a pitch of the mark on the side of the object plane under the second condition.

3. The method according to claim 1, wherein data of the first focal position in the direction of the optical axis of the projection optical system under the first measurement condition and data indicating a relation between the focal position in the direction of the optical axis of the projection optical system and the spherical aberration amount under the second measurement condition are acquired in advance.

4. An exposure apparatus for exposing a substrate using a projection optical system, the exposure apparatus comprising:

a detection unit configured to detect light passing through a mark on the side of an image plane at a plurality of positions in a direction of an optical axis of the projection optical system by illuminating a mark on the side of an object plane so as to project an image of the mark on the side of the object plane onto the mark on the side of the image plane using the projection optical system; and a calculation unit configured to calculate a spherical aberration amount of the projection optical system based on a detection result by the detection unit, wherein a first focal position in the direction of the optical axis of the projection optical system is measured by illuminating the mark on the side of the object plane using a first measurement condition so as to project the image of the mark on the side of the object plane onto the mark on the side of the image plane using the projection optical system and by detecting light passing through the mark on the side of the image plane at a plurality of positions in the direction of the optical axis of the projection optical system using the detection unit, wherein a second focal position in the direction of the optical axis of the projection optical system is measured by illuminating the mark on the side of the object plane using a second measurement condition so as to project the image of the mark on the side of the object plane onto the mark on the side of the image plane using the projection optical system and by detecting light passing through the mark on the side of the image plane at a plurality of positions in the direction of the optical axis of the projection optical system using the detection unit, wherein the calculation unit calculates the spherical aberration amount based on a difference between the first focal position and the second focal position, wherein the first measurement condition is a condition under which the focal position in the direction of the optical axis of the projection optical system does not change according to the spherical aberration amount, and wherein the second measurement condition is a condition under which the focal position in the direction of the optical axis of the projection optical system changes according to the spherical aberration amount.

5. A method for manufacturing a device, the method comprising:

exposing a substrate using an exposure apparatus; and developing the exposed substrate, wherein the exposure apparatus comprises:

a detection unit configured to detect light passing through a mark on the side of an image plane at a plurality of positions in a direction of an optical axis of the projection optical system by illuminating a mark on the side of an object plane so as to project an image of the mark on the side of the object plane onto the mark on the side of the image plane using the projection optical system; and a calculation unit configured to calculate a spherical aberration amount of the projection optical system based on a detection result by the detection unit, wherein a first focal position in the direction of the optical axis of the projection optical system is measured by illuminating the mark on the side of the object plane using a first measurement condition so as to project the image of the mark on the side of the object plane onto the mark on the side of the image plane using the projection optical system and by detecting light passing through the mark on the side of the image plane at a plurality of positions in the direction of the optical axis of the projection optical system using the detection unit, wherein a second focal position in the direction of the optical axis of the projection optical system is measured by illuminating the mark on the side of the object plane using a second measurement condition so as to project the image of the mark on the side of the object plane onto the mark on the side of the image plane using the projection optical system and by detecting light passing through the mark on the side of the image plane at a plurality of positions in the direction of the optical axis of the projection optical system using the detection unit, wherein the calculation unit calculates the spherical aberration amount based on a difference between the first focal position and the second focal position, wherein the first measurement condition is a condition under which the focal position in the direction of the optical axis of the projection optical system does not change according to the spherical aberration amount, and wherein the second measurement condition is a condition under which the focal position in the direction of the optical axis of the projection optical system changes according to the spherical aberration amount.

* * * * *